United States Patent
Blakemore et al.

(10) Patent No.: US 9,530,904 B2
(45) Date of Patent: Dec. 27, 2016

(54) HIGH TEMERATURE, HERMETICALLY SEALED, TRIAXIAL MOUNT FOR A LIGHT SENSITIVE ELEMENT

(71) Applicant: General Electric Company, Schenectady, NY (US)

(72) Inventors: Joseph Cleary Blakemore, Stow, OH (US); Troy David Hazelton, Sagamore Hills, OH (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 170 days.

(21) Appl. No.: 14/494,856

(22) Filed: Sep. 24, 2014

(65) Prior Publication Data

US 2016/0087112 A1    Mar. 24, 2016

(51) Int. Cl.
| | |
|---|---|
| H01L 31/00 | (2006.01) |
| H01L 31/0203 | (2014.01) |
| H01L 31/02 | (2006.01) |
| G01J 5/00 | (2006.01) |
| G01J 5/20 | (2006.01) |
| G01J 5/04 | (2006.01) |
| F23M 11/04 | (2006.01) |
| F23N 5/08 | (2006.01) |
| H05K 5/00 | (2006.01) |
| H02G 15/02 | (2006.01) |

(52) U.S. Cl.
CPC ........ *H01L 31/0203* (2013.01); *F23M 11/045* (2013.01); *F23N 5/082* (2013.01); *G01J 5/0018* (2013.01); *G01J 5/042* (2013.01); *G01J 5/045* (2013.01); *G01J 5/20* (2013.01); *H01L 31/02* (2013.01); *H01L 31/02005* (2013.01); *H05K 5/00* (2013.01); *F23N 2029/00* (2013.01); *F23N 2900/05005* (2013.01); *H02G 15/025* (2013.01)

(58) Field of Classification Search
CPC .......................... H01L 31/0203; G01D 11/245
USPC .................... 250/221, 239, 554; 431/6, 66
See application file for complete search history.

(56) References Cited

U.S. PATENT DOCUMENTS

| | | | |
|---|---|---|---|
| 9,188,463 B2 * | 11/2015 | Olechnowicz | ....... G01D 11/245 |
| 2013/0318994 A1 | 12/2013 | Hoffman et al. | |
| 2014/0124260 A1 | 5/2014 | Blakemore et al. | |

OTHER PUBLICATIONS

PCT Search Report and Written Opinion issued in connection with corresponding PCT Application No. PCT/US2015/044798 on Nov. 20, 2015.

* cited by examiner

*Primary Examiner* — Kevin Pyo
(74) *Attorney, Agent, or Firm* — Cooper Legal Group, LLC

(57) ABSTRACT

A sensor assembly for a flame sensor apparatus includes a photodiode that generates a current. The sensor assembly includes a seal assembly supporting the photodiode. The seal assembly includes an inner conductor defining an inner conductor end. The inner conductor includes an inner conductor surface disposed at the inner conductor end. The photodiode is attached to the inner conductor end of the inner conductor and to a middle conductor end of a middle conductor. The photodiode is electrically connected to the inner conductor surface. The seal assembly is triaxial so as to protect the current generated by the photodiode. The seal assembly withstands temperatures up to or greater than about 325° C. The seal assembly forms a hermetic barrier that, with the photodiode supported within a sealed volume, limits the passage of materials/gases through the seal assembly.

20 Claims, 4 Drawing Sheets

HIGH TEMERATURE, HERMETICALLY SEALED, TRIAXIAL MOUNT FOR A LIGHT SENSITIVE ELEMENT

BACKGROUND

Field of the Invention

The invention relates to a flame sensor apparatus, and specifically relates to a seal assembly for a flame sensor apparatus which senses characteristics of a flame in a combustion chamber.

Discussion of Prior Art

Within an oil or gas fueled turbine, fuel is fed into a combustion chamber within which an ignition flame is present. If the flame becomes extinguished, commonly referred to as a flame-out condition, it is undesirable for fuel to continue to be fed into the hot combustion chamber without appropriate ignition. Consequently, if the ignition flame is extinguished within the combustion chamber, the fuel feed into the combustion chamber should be quickly terminated and thus limit un-combusted fuel build up.

A flame sensor is generally used for detecting the presence or absence of an ignition flame, as well as the flame's relative intensity, within a combustion chamber of a gas turbine. Also, flame sensing electronics are commonly associated with the flame sensor within the turbine arrangement. The flame sensing electronics may be temperature sensitive and can be located a distance from the relatively hot temperature(s) in and near the combustion chamber. A low magnitude current signal from a sensor assembly near the combustion chamber can be transferred to the flame sensing electronics. The signal can be transferred via a cable assembly that is part of a sealed environment which helps preserve the low magnitude current signal. It would be useful to provide a sensor assembly that is capable of withstanding relatively high temperatures near the combustion chamber while producing the low magnitude current signal.

BRIEF DESCRIPTION

The following summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

In accordance with one aspect, the present invention provides a sensor assembly for a flame sensor apparatus. The sensor assembly includes a photodiode configured to generate a current. The sensor assembly includes a seal assembly supporting the photodiode. In some examples, the seal assembly is hermetic. The seal assembly includes an inner conductor defining an inner conductor end, the inner conductor including an inner conductor surface disposed at the inner conductor end. The photodiode is attached to the inner conductor end of the inner conductor. The photodiode is electrically connected to the inner conductor surface.

In accordance with another aspect, the present invention provides a sensor assembly for a flame sensor apparatus. The sensor assembly includes a photodiode configured to generate a current. The sensor assembly includes a seal assembly supporting the photodiode. The seal assembly includes a middle conductor extending within a housing, the middle conductor defining a middle conductor volume. The middle conductor includes a middle conductor surface disposed at a middle conductor end of the middle conductor. The seal assembly includes an inner conductor extending within the middle conductor volume and defining an inner conductor end. The inner conductor including an inner conductor surface disposed at the inner conductor end. The photodiode is attached to the inner conductor end of the inner conductor. The photodiode is electrically connected to the middle conductor surface and to the inner conductor surface.

In accordance with yet another aspect, the present invention provides a flame sensor apparatus including a photodiode configured to generate a current. The flame sensor apparatus includes a seal assembly supporting the photodiode. The seal assembly includes an inner conductor defining an inner conductor end. The inner conductor includes an inner conductor surface disposed at the inner conductor end. The photodiode is attached to the inner conductor end of the inner conductor. The photodiode is electrically connected to the inner conductor surface such that the current is transmitted through the inner conductor surface.

BRIEF DESCRIPTION OF THE DRAWINGS

The foregoing and other aspects of the invention will become apparent to those skilled in the art to which the invention relates upon reading the following description with reference to the accompanying drawings, in which.

DETAILED DESCRIPTION OF THE INVENTION

Figure 1:
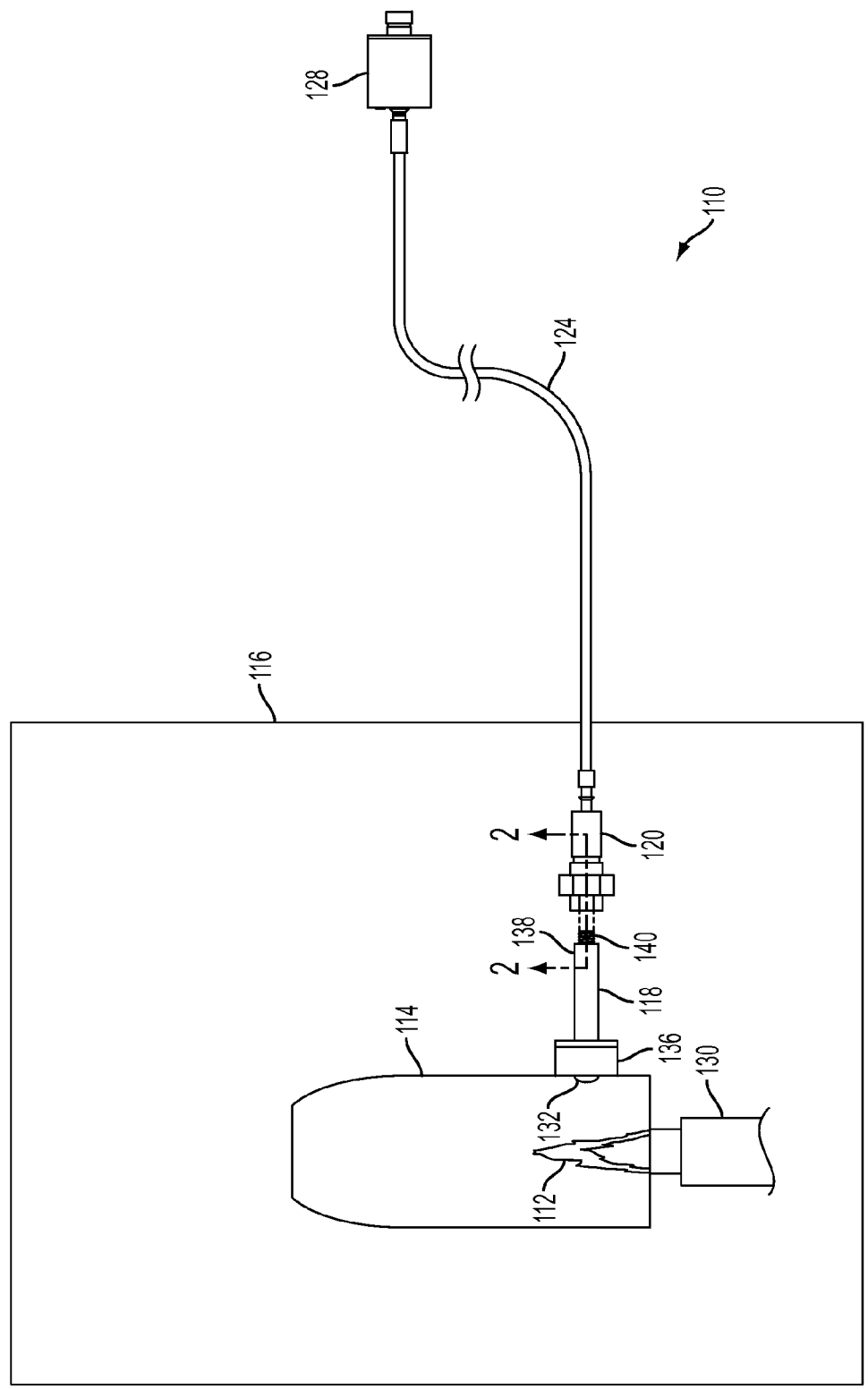
FIG. 1 is a partially exploded, schematized, partially cross-section view of an example flame sensor apparatus in accordance with at least one aspect of the present invention.

Example embodiments that incorporate one or more aspects of the invention are described and illustrated in the drawings. These illustrated examples are not intended to be a limitation on the invention. For example, one or more aspects of the invention can be utilized in other embodiments and even other types of devices. Moreover, certain terminology is used herein for convenience only and is not to be taken as a limitation on the invention. Still further, in the drawings, the same reference numerals are employed for designating the same elements.

FIG. 1 schematically illustrates an example flame sensor apparatus 110 for monitoring specific characteristics of a flame 112. The flame 112 is located within a combustion chamber 114 of a turbine 116 and emits electromagnetic radiation energy. A sight tube 118 can be attached to the combustion chamber 114. A sensor assembly 120 is operably connected with the combustion chamber 114 and can receive the electromagnetic radiation energy from the flame 112 through the sight tube 118. The sensor assembly 120 includes a photodiode, which generates a current, such as a photocurrent, based on the electromagnetic radiation energy. This current can then pass from the sensor assembly 120, through a cable assembly 124, and to an electrical assembly 128, whereupon the electrical assembly 128 can determine the flame's characteristics, such as the presence or absence of the flame, relative intensity of the flame, or combustion efficiency based on the spectrum the flame 112 emits. In an example, the electrical assembly 128 can be physically remote from the photodiode within the sensor assembly 120. As such, the electrical assembly 128 monitors the flame's characteristics while being located in a relatively cooler environment away from the combustion chamber 114 and turbine 116 and heat associated with the flame of combustion.

Turning to the example shown in FIG. 1, the turbine 116 can include rotating turbine blades (not shown) powered by fuel combustion within the combustion chamber 114. The turbine 116 is generically illustrated in FIG. 1 to convey the concept that the turbine 116 can include a number of different structures and/or could be used in varied, different applications. For example, the turbine 116 could be constructed/configured for oil and gas combustion turbines and used in applications such as for aircraft propulsion, marine propulsion, land-based power generation, off shore power generation, or the like. In an example, the turbine 116 and flame sensor apparatus 110 can be used in power generation applications. As such, it is to be appreciated that the turbine 116 in FIG. 1 is not intended to be limiting on further examples.

The combustion chamber 114 can be positioned within the turbine 116. The combustion chamber 114 can define a substantially hollow internal area. It is to be understood that the combustion chamber 114 is generically represented in FIG. 1, and is not intended to be limiting on further examples. For instance, the generic representation of the combustion chamber 114 is intended to convey the concept that the combustion chamber 114 can represent a number of different constructions, some of which may be generally known. Similarly, the combustion chamber 114 described herein and as in association with the turbine 116 discussed above may be incorporated into a number of different applications.

A fuel nozzle 130 can be provided that delivers fuel (e.g., air, fuel, combustible materials, etc.) into the combustion chamber 114. The fuel nozzle 130 can cooperate with an opening, orifice, or the like in the combustion chamber 114 such that the fuel nozzle 130 can deliver the fuel from an exterior location into the combustion chamber 114. As such, the fuel nozzle 130 can deliver the fuel into the combustion chamber, whereupon the fuel can be ignited to propagate the flame 112. Ignited fuel within the combustion chamber 114 produces a relatively high-pressure gas. Again, the fuel nozzle 130 is generically represented in the shown example, and may include any number of fuel nozzle constructions that may be known. Further, the fuel nozzle 130 could be positioned at a number of locations within the combustion chamber 114, and is not limited to the location shown in FIG. 1.

An opening 132 can be provided in an outer wall of the combustion chamber 114. The opening 132 (illustrated in FIG. 1) can extend completely through the outer wall. As such, an interior of the combustion chamber 114 can be optically exposed to a location that is exterior from the combustion chamber 114. The opening 132 can be positioned in near proximity to the flame 112, such that the opening 132 defines an optical path through the opening 132 and towards the flame 112. The temperature adjacent the opening 132 can, in one example, be greater than about 325° C., though a wide range of temperatures are contemplated. It is to be understood that the opening 132 is not limited to the location shown in FIG. 1, and could be positioned at a number of different locations on the combustion chamber 114.

The sight tube 118 is located in the optical path from the flame 112 and through the opening 132. FIG. 1 depicts the sight tube 118 for illustrative purposes to show the structural relationship between the sight tube 118 and the opening 132. It is to be understood, however, that in operation, the sight tube 118 and combustion chamber 114 are in a fully assembled state with the sight tube 118 attached to the combustion chamber 114. The sight tube 118 can be attached to the combustion chamber 114 in any number of ways, such as by mechanical fasteners, welding, adhesives, or the like.

In one example, the sight tube 118 can be an elongated, substantially hollow cylindrical structure that defines an internal bore. The sight tube 118 is attached to the opening 132, such that an interior of the combustion chamber 114 is optically exposed to the internal bore of the sight tube 118. In operation, the internal bore of the sight tube 118 can be aligned with the opening 132, such that the sight tube 118 defines an optical path through the internal bore, through the opening 132, and into the interior area of the combustion chamber 114. As such, electromagnetic radiation energy from the flame 112 propagates through the internal bore of the sight tube 118.

The sight tube 118 can include a proximal end 136 and a distal end 138. The proximal end 136 is located near the opening 132, and the distal end 138 is located opposite the proximal end 136. An attachment structure, such as a threaded portion or a screw thread 140, can be positioned at the distal end 138 of the sight tube 118. It is to be understood that the sight tube 118 could include any number of attachment structures, and is not limited to the screw thread 140 shown in FIG. 1. In one example, the screw thread 140 can be formed at an outer surface of the distal end 138 of the sight tube 118, so as to form an external male thread. The sensor assembly 120 can be threadingly engaged with the screw thread 140 on the sight tube 118.

Figure 2:
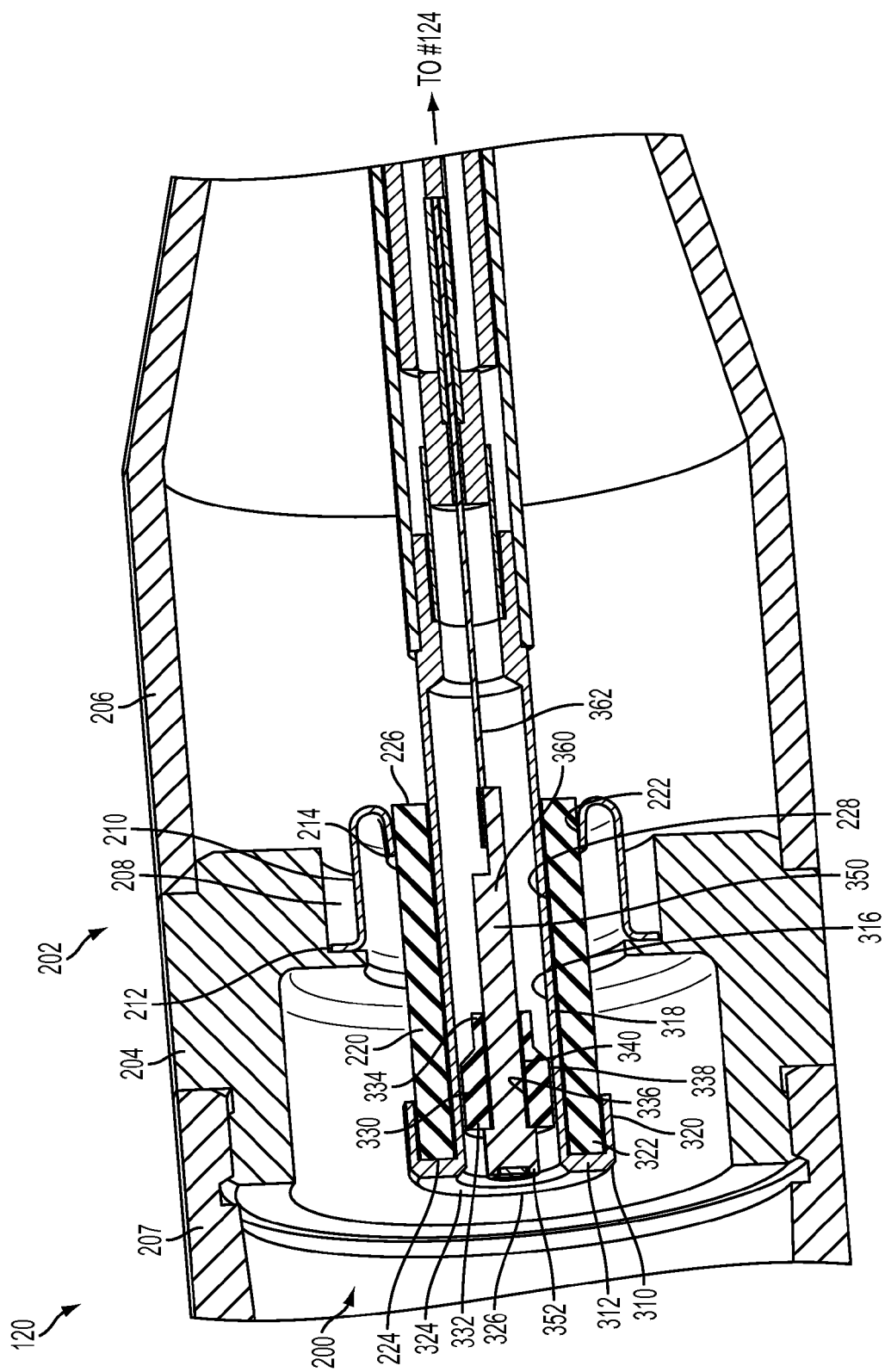
FIG. 2 is a sectional view of an example sensor assembly along lines 2-2 of FIG. 1.

Turning to FIG. 2, a sectional view of a portion of the sensor assembly 120 along lines 2-2 of FIG. 1 is illustrated. What follows is a simplified description for the purpose of clarity, and it is to be appreciated that the sensor assembly 120 can include additional components than those described here.

The sensor assembly 120 can include a seal assembly 200 positioned within a housing 202. The housing 202 can include one or more housing portions. In the illustrated example of FIG. 2, the housing 202 includes a first housing portion 204 and a second housing portion 206. The first housing portion 204 and the second housing portion 206 can be attached together in any number of ways, such as by welding, brazing, screw threading, etc. Once attached, the first housing portion 204 and the second housing portion 206 can extend generally coaxially with respect to each other along a common axis. In this example, the first housing portion 204 can be attached to a third housing portion 207 (such as a lens housing, for example), with the third housing portion 207 of the housing 202 being directly or indirectly attached to the sight tube 118.

The housing 202, including the first housing portion 204 and the second housing portion 206, can define an internal volume 208. The internal volume 208 is generally hollow, such that one or more structures, components, etc. can be positioned therein. In this example, the seal assembly 200 can be positioned at least partially within the internal volume 208.

Turning now to the seal assembly 200, the seal assembly 200 can form a hermetic barrier that limits/prevents passage of unwanted/unintended materials and/or gases through the seal assembly 200. As will be described in detail, the seal assembly 200 can be attached and sealed to the first housing portion 204 of the housing. As such, the seal assembly 200 can form a hermetic barrier with respect to the first housing portion 204. The seal assembly 200 can therefore form/define one boundary of a sealed volume (e.g., within the first housing portion 204 and the third housing portion 207), within which a light sensitive element (e.g., a photodiode) can be located.

The seal assembly 200 can include an outer conductor 210. The outer conductor 210 can be disposed within the internal volume 208 of the housing 202 and can be attached to the housing 202. In an example, the outer conductor 210 extends between a first end 212 and a second end 214. The outer conductor 210 can have a generally non-linear shape, and in the example of FIG. 2, may include one or more bends, curves, undulations, etc. The outer conductor 210 may be relatively thin in thickness as compared to a length, such that the outer conductor 210 has at least some degree of flexibility, elasticity, springiness, etc. In operation, the outer conductor 210 can compensate for radial stresses of an insulator (as will be described below) caused by thermal expansion. The outer conductor 210 can have an annular shape, such as by extending around an axis (e.g., circularly, etc.) within the internal volume 208. As such, in the event of differences in thermal expansion, the shape of the outer conductor 210 can allow for flexing, bending, or the like, which reduces radial stresses.

The outer conductor 210 can be attached to the first housing portion 204. More particularly, the first end 212 of the outer conductor 210 can be attached to a housing wall of the first housing portion 204. In some examples, the housing wall can extend radially with respect to the housing 202, such that the housing wall projects towards a center of the housing 202. Accordingly, the first end 212 can be attached to the housing wall in any number of ways, such as by brazing, bonding, welding, etc. In an example, the first end 212 of the outer conductor 210 forms a seal (e.g., hermetic barrier) with respect to the first housing portion 204. The housing wall is not limited to extending radially, and in other examples, may extend in any number of directions, such as, for example, by extending axially along the housing 202, or the like.

The outer conductor 210 includes any number of materials, such as metallic materials. In some examples, the outer conductor 210 may act as an electrical conductor. That is, the outer conductor 210 can include materials that allow for the flow of electrical current in one or more directions through the outer conductor 210. In an example, the outer conductor 210 can be electrically grounded to the sensor assembly 120 through its connection to the first housing portion 204. In some examples, the outer conductor 210 can include metallic materials such as a nickel material, though, other materials are envisioned. In an example, the outer conductor 210 facilitates brazing, bonding, welding, etc. of the outer conductor 210 to other structures, components, etc. within the sensor assembly 120. In an example, the outer conductor 210, which may include a metallic material, can withstand relatively high temperatures, such as in a range of 325° C. or greater, to which the seal assembly 200 may be exposed in operation.

The seal assembly 200 can include a first insulator 220. The first insulator 220 can be disposed within an outer conductor volume 222 of the outer conductor 210. The first insulator 220 can extend between a first end 224 and a second end 226. In some examples, the first insulator 220 extends generally coaxially with respect to the outer conductor 210 and the housing 202. The first insulator 220 can have an annular shape, such as by extending around an axis (e.g., circularly, etc.) within the internal volume 208. In an example, the first insulator 220 has a generally cylindrical shape with a hollow center that defines a first insulator volume 228. The first insulator 220 includes any number of materials, including inorganic materials that have at least some degree of electrical insulation such that the first insulator 220 can electrically insulate one or more of the electrical conductors of the seal assembly 200. That is, the first insulator 220 includes materials whose internal electric charges may not flow freely such that electrical current is generally limited from passing through the first insulator 220. In an example, the first insulator 220 includes an inorganic material such as alumina, though any number of different materials (e.g., magnesia, silica, etc.) are envisioned. In an example, the first insulator 220, which may include an inorganic material (e.g., a high temperature inorganic material), can withstand relatively high temperatures, such as in a range of 325° C. or greater, to which the seal assembly 200 may be exposed in operation.

Figure 3:
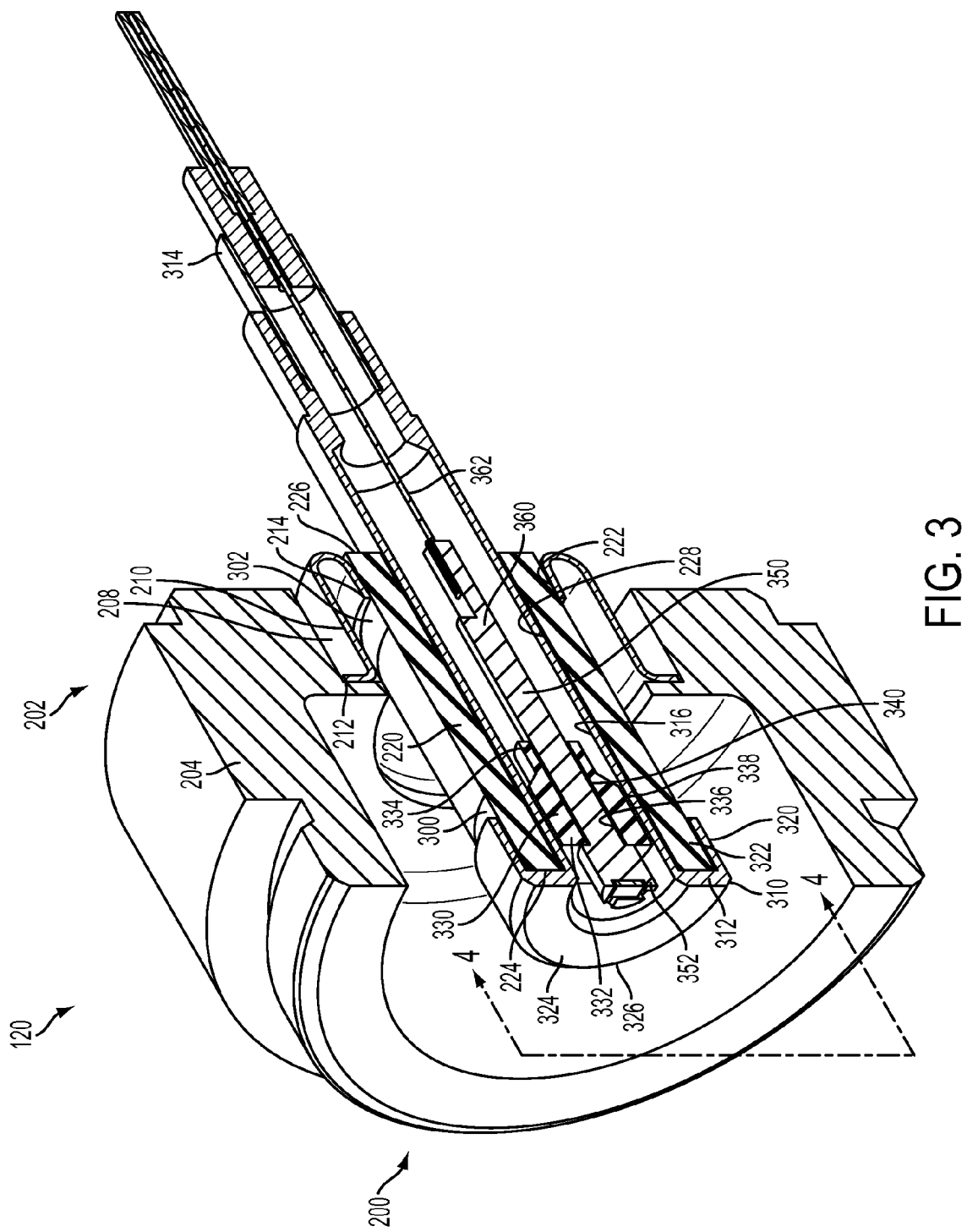
FIG. 3 is a sectional perspective view of the example sensor assembly of FIG. 2.

Turning to FIG. 3, the sensor assembly 120 is again illustrated. As illustrated, the first insulator 220 can include one or more attachment structures for attaching the sensor assembly 120 to other structures, components, etc. within the housing 202. For example, the first insulator 220 can include a first attachment structure 300 and a second attachment structure 302. The first attachment structure 300 can be positioned at the first end 224 of the first insulator 220 while the second attachment structure 302 can be positioned at the second end 226. In some examples, the first attachment structure 300 and the second attachment structure 302 can be wrapped circumferentially around an outer perimeter of the first insulator 220, such that the first attachment structure 300 and/or the second attachment structure 302 can extend partially or completely circumferentially around the first insulator 220.

The first attachment structure 300 and the second attachment structure 302 include any number of materials, including inorganic materials. In an example, the first attachment structure 300 and the second attachment structure 302 include a material that is different from the material that forms the first insulator 220. For example, the first attachment structure 300 and the second attachment structure 302 can include metal materials (e.g., steel, nickel, etc.) so as to facilitate brazing, bonding, welding, and/or other metal joining processes. In the illustrated example, the second attachment structure 302 can be attached to (e.g., by brazing, bonding, welding, or other metal joining processes) the second end 214 of the outer conductor 210. In an example, the second end 214 of the outer conductor 210 forms a seal (e.g., hermetic barrier) with respect to the second attachment structure 302 of the first insulator 220. As such, the second attachment structure 302 functions such that the first insulator 220 (e.g., an outer radial side of the first insulator 220) can be attached to the outer conductor 210. In an example, the first attachment structure 300 and the second attachment structure 302, which may include inorganic materials, can withstand relatively high temperatures, such as in a range of 325° C. or greater, to which the seal assembly 200 may be exposed in operation.

The seal assembly 200 can include a middle conductor 310. The middle conductor 310 can be disposed within the first insulator volume 228 of the first insulator 220. In an example, the middle conductor 310 extends within the first insulator volume 228, such that the middle conductor 310 extends generally coaxially with respect to the first insulator 220, the outer conductor 210 and the housing 202. The middle conductor 310 can extend between a first middle conductor end 312 and a second middle conductor end 314. The middle conductor 310 can have a generally linear shape, though in other examples, the middle conductor 310 may not extend linearly, such as by including one or more bends, curves, undulations, etc. The middle conductor 310 can have an annular shape, such as by extending cylindrically within the housing 202. In an example, the middle conductor 310 is generally hollow, and can define a middle conductor volume 316.

The middle conductor 310 includes any number of materials, including metallic materials that act as electrical conductors. That is, the middle conductor 310 can include materials that allow for the flow of electrical current in one or more directions through the middle conductor 310. In some examples, the middle conductor 310 can include a metallic material such as a nickel material, though, other materials are envisioned. In an example, the middle conductor 310 facilitates brazing, bonding, welding, etc. of the middle conductor 310 to other structures, components, etc. within the sensor assembly 120. In an example, the middle conductor 310, which may include a metallic material, can withstand relatively high temperatures, such as in a range of 325° C. or greater, to which the seal assembly 200 may be exposed in operation.

The middle conductor 310 can include a first wall 318 and a second wall 320 (as illustrated in FIG. 2). The first wall 318 is an elongated wall that defines the middle conductor volume 316 therein. The first wall 318 can extend between the first middle conductor end 312 and the second middle conductor end 314. In the illustrated example, the first wall 318 can extend along a linear axis while having at least some variation in thickness, shape, etc. For example, the first wall 318 can include changes in thickness/shape such that the middle conductor volume 316 has a non-constant cross-sectional size. That is, in the illustrated example, the middle conductor volume 316 can have a reduced cross-sectional size (e.g., diameter) at the second middle conductor end 314 as compared to a cross-sectional size (e.g., diameter) at the first middle conductor end 312.

The second wall 320 can be radially spaced apart from the first wall 318 to define a first opening 322 therebetween. In an example, the second wall 320 extends a distance that is less than the first wall 318. For example, the second wall 320 can extend from the first middle conductor end 312, but may end before the second middle conductor end 314. The second wall 320 can be radially spaced apart from the first wall 318 a distance that generally matches a radial thickness of the first insulator 220. As such, a portion of the first insulator 220, including the first end 224, can be positioned within the first opening 322 between the first wall 318 and the second wall 320 (as illustrated in FIG. 3).

In the illustrated example, the first attachment structure 300 can be attached to the middle conductor 310. More particularly, the first attachment structure 300 can be attached to (e.g., by brazing, bonding, welding, or other metal joining processes) the second wall 320 of the middle conductor 310. As such, the first attachment structure 300 functions such that the first insulator 220 can be attached to the middle conductor 310. In an example, the first attachment structure 300 forms a seal (e.g., hermetic barrier) with respect to the middle conductor 310.

The middle conductor 310 includes a middle conductor surface 324 disposed at the first middle conductor end 312 of the middle conductor 310. In an example, the middle conductor surface 324 extends perpendicularly with respect to a direction along which the first wall 318 or the second wall 320 extends. The middle conductor surface 324 is generally flat/planar in this example, though, in other examples, may have a non-flat shape.

In an example, the middle conductor surface 324 includes a middle conductor surface material 326 that, in some examples, can be different than the middle conductor material of the rest of (e.g., portions of the middle conductor 310 that do not include the middle conductor surface 324) the middle conductor 310. The middle conductor surface material 326 can include a conductive corrosion resistant material. In one possible example, the middle conductor surface material 326 can include a gold material while the middle conductor 310 may include a non-gold material (e.g., nickel material, etc.). The middle conductor surface material 326 (e.g., gold material, etc.) can facilitate wire bonding/brazing. In some examples, the middle conductor surface material 326 can be plated onto the middle conductor surface 324, though other methods of attachment are contemplated. In other examples, the middle conductor surface material 326 may include the same material as the middle conductor 310.

The seal assembly 200 can include a second insulator 330. The second insulator 330 can be disposed within the middle conductor volume 316 of the middle conductor 310. The second insulator 330 can extend between a first end 332 and a second end 334. In some examples, a length of the second insulator 330 between the first end 332 and the second end 334 is less than a length of the middle conductor 310 between the first middle conductor end 312 and the second middle conductor end 314. The second insulator 330 can extend generally coaxially with respect to the outer conductor 210, the housing 202, the first insulator 220, and the middle conductor 310.

The second insulator 330 can have an annular shape, such as by extending generally cylindrically within the middle conductor volume 316. In an example, the second insulator 330 has the generally cylindrical shape with a hollow center that defines a second insulator volume 336. The second insulator 330 includes any number of materials, including inorganic materials, that have at least some degree of electrical insulation such that the first insulator 220 can electrically insulate one or more of the electrical conductors of the seal assembly 200. That is, the second insulator 330 includes materials whose internal electric charges may not flow freely such that electrical current is generally limited from passing through the second insulator 330. In an example, the second insulator 330 includes alumina, though any number of different materials (e.g., magnesia, silica, etc.) are envisioned. In a possible example, the second insulator 330 includes the same material as the first insulator 220. In an example, the second insulator 330, which may include an inorganic material (e.g., a high temperature inorganic material), can withstand relatively high temperatures, such as in a range of 325° C. or greater, to which the seal assembly 200 may be exposed in operation.

The second insulator 330 can extend radially between an outer radial side 338 and an inner radial side 340. In an example, the second insulator 330 can be attached to the middle conductor 310 at the outer radial side 338 of the second insulator 330. The second insulator 330 can be attached in any number of ways to the first wall 318 of the middle conductor 310. In an example, the second insulator 330 can include an attachment structure (e.g., similar to the first attachment structure 300 or the second attachment structure 302) that extends circumferentially around an outer perimeter of the second insulator 330. The attachment structure can include a metal material (e.g., steel, nickel, etc.) so as to facilitate brazing, bonding, welding, and/or other metal joining processes. As such, the second insulator 330 can be attached to the middle conductor 310, such as by brazing an attachment structure at the outer radial side 338 to the middle conductor 310. In an example, this attachment can form a seal between the middle conductor 310 and the outer radial side 338 of the second insulator 330.

The seal assembly can include an inner conductor 350. The inner conductor 350 can be disposed within the second insulator volume 336 of the second insulator 330 and within the middle conductor volume 316 of the middle conductor 310. In an example, the inner conductor 350 extends within the second insulator volume 336, such that the inner conductor 350 extends generally coaxially with respect to the first insulator 220, the outer conductor 210, the housing 202, and the inner conductor 350. The inner conductor 350 can extend from an inner conductor end 352 towards an opposing end, such as by extending towards and/or through the cable assembly 124.

The inner conductor 350 includes any number of materials, including metallic materials that act as electrical conductors. That is, the inner conductor 350 can include materials that allow for the flow of electrical current in one or more directions through the inner conductor 350. In some examples, the inner conductor 350 can include a Kovar material, though, other materials are envisioned. Depending on the material used (e.g., Kovar, etc.), a coefficient of thermal expansion of the inner conductor 350 can be similar to and/or match a coefficient of thermal expansion of the second insulator 330 (e.g., alumina, etc.). As such, expansion/contraction of the inner conductor 350, the second insulator 330, etc. during operation up to or greater than 325° C. is generally similar, such that inadvertent cracking, fracture, etc. of the inner conductor 350, the second insulator 330, etc. is generally limited. In an example, the inner conductor 350, which may include a metallic material, can withstand relatively high temperatures, such as in a range of 325° C. or greater, to which the seal assembly 200 may be exposed in operation.

In an example, the inner conductor 350 facilitates brazing, bonding, welding, etc. of the inner conductor 350 to other structures, components, etc. within the sensor assembly 120. In an example, the inner conductor 350 includes a first inner conductor portion 360 and a second inner conductor portion 362. The second inner conductor portion 362 can include a wire, for example, and may be mechanically and electrically connected (e.g., by spot-welding, etc.) to the first inner conductor portion 360 opposite the inner conductor end 352. In some examples, the second inner conductor portion 362 includes an electrically conductive material, such as nickel, for example.

The inner conductor 350 can be attached to the second insulator 330. For example, the inner conductor 350 can be attached to the inner radial side 340 of the second insulator 330. The inner conductor 350 and the second insulator 330 can be attached in any number of ways. In an example, the second insulator 330 can include an attachment structure (e.g., similar to the first attachment structure 300 or the second attachment structure 302) that extends circumferentially around an inner perimeter of the second insulator 330. The attachment structure can include a metal material (e.g., steel, nickel, etc.) so as to facilitate brazing, bonding, welding, and/or other metal joining processes. As such, the second insulator 330 can be attached to the inner conductor 350, such as by brazing an attachment structure at the inner radial side 340 to the inner conductor 350. In an example, this attachment can form a seal between the inner conductor 350 and the inner radial side 340 of the second insulator 330.

The second insulator 330 can form a seal with both of the inner conductor 350 and the middle conductor 310. In an example, this seal is a hermetic seal that limits fluid transfer into the middle conductor volume 316. For example, air, gas, liquids, etc. are limited from passing through the second insulator 330 into and/or out of the middle conductor volume 316. In some examples, the middle conductor volume 316 can be filled with a gas, such as a dry, inert gas.

Figure 4:
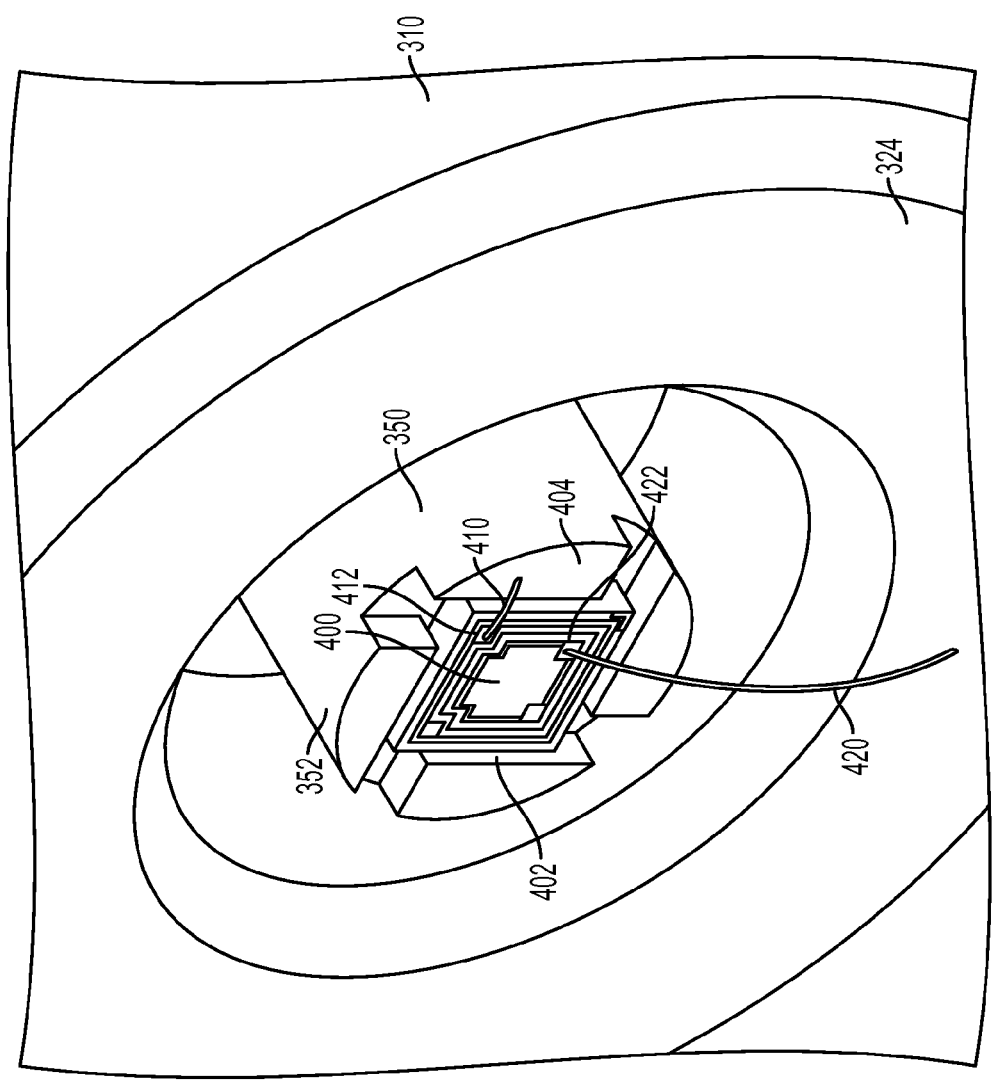
FIG. 4 is a perspective view of an example photodiode of the example sensor assembly along lines 4-4 of FIG. 3.

Turning to FIG. 4, a perspective view of the inner conductor end 352 of the inner conductor 350 is illustrated along lines 4-4 of FIG. 3. In an example, the inner conductor 350 can support a photodiode 400. The photodiode 400 can be attached to the inner conductor end 352 of the inner conductor 350. In some examples, the photodiode 400 can include a solid state ultraviolet (UV) sensor that receives the focused electromagnetic radiation energy from the flame 112. It is understood that a variety of photodiodes can be used in the sensor assembly 120.

As the photodiode 400 receives the electromagnetic radiation energy, it generates a current output signal, such as a photocurrent, based on the electromagnetic radiation energy. The electromagnetic radiation energy can include UV radiation. The photodiode 400 can generate a photocurrent that is proportional to the intensity level of the UV radiation received. The photocurrent can be relatively low magnitude, such as in a range of about $10^{-10}$ amperes. In one example, the current output signal can be delivered from the photodiode and be conditioned and supplied to a control system. In response, the signal can be used to activate a shut-off (not shown) to stop the flow of fuel to the combustion chamber 114.

The photodiode 400 can be mounted within a recess 402 of an inner conductor surface 404 of the inner conductor 350. The photodiode 400 can be mounted within the recess 402 in any number of ways, such as by brazing, bonding, etc. In an example, the inner conductor surface 404 is disposed at the inner conductor end 352 of the inner conductor 350. The inner conductor surface 404 can include an inner conductor surface material that is different than an inner conductor material. In an example, the inner conductor material of the inner conductor 350 includes a nickel material. In such an example, the inner conductor surface material of the inner conductor surface 404 includes a gold material. According to some examples, the inner conductor surface material can include a conductive corrosion resistant material. In an example, the inner conductor surface 404 and the middle conductor surface material 326 of the middle conductor surface 324 may include the same material, such as a gold material, for example. In some examples, the inner conductor surface material can be plated onto the inner conductor surface 404, though other methods of attachment are contemplated. In other examples, the inner conductor surface material may include the same material as the inner conductor 350.

The photodiode 400 can be electrically connected to the inner conductor surface 404 and to the middle conductor surface 324. For example, a first wire 410 can extend between a first contact 412 of the photodiode 400 and the inner conductor surface 404. The first wire 410 can include, for example, a similar or matching material as the inner conductor surface 404, such as a gold material, for example. In this example, the first wire 410 can be electrically connected to the photodiode 400 through the first contact 412. The first wire 410 can be electrically connected to the inner conductor 350 through the inner conductor surface 404. The first wire 410 can be electrically connected to the inner conductor surface 404 in any number of ways, such as by brazing, wire bonding, or the like.

The photodiode 400 can be electrically connected to the middle conductor 310. For example, a second wire 420 can extend between a second contact 422 of the photodiode 400 and the middle conductor surface 324. The second wire 420 can include, for example, a similar or matching material as the middle conductor surface 324, such as a gold material, for example. In this example, the second wire 420 can be electrically connected to the photodiode 400 through the second contact 422. The second wire 420 can be electrically connected to the middle conductor 310 through the middle conductor surface 324. The second wire 420 can be electrically connected to the middle conductor surface 324 in any number of ways, such as by brazing, wire bonding, or the like.

In operation, the photocurrent can be transmitted from the photodiode 400 through at least one of the middle conductor 310 or the inner conductor 350. In a possible example, the first wire 410 can receive the photocurrent from the photodiode 400. The photocurrent can be transmitted through the first wire 410 and through the inner conductor 350. The photocurrent can then be transmitted from the inner conductor 350 and through the cable assembly 124 (illustrated in FIG. 1). The cable assembly 124 can convey the photocurrent, which is indicative of the flame's characteristics, from the photodiode 400 to a location that is physically remote from the photodiode 400. This location can, for example, be in a relatively cooler environment than the environment near the combustion chamber 114. In an example, the cable assembly 124 can be relatively long, such as in a range of about 9.1 to 10.7 meters (e.g. 30 to 35 feet). As such, the electrical assembly 128 can be positioned/located in this relatively cooler environment, with the photocurrent being delivered to the electrical assembly 128.

In some examples, the middle conductor 310 can function as a shield current path. For example, the photodiode 400 can generate an electrical signal (e.g., the photocurrent) that is indicative of the characteristics of the flame 112. In a possible example, the second wire 420 can receive the photocurrent from the photodiode 400. The photocurrent can be transmitted through the second wire 420 and through the middle conductor 310. The photocurrent can then be transmitted from the middle conductor 310 and through the cable assembly 124 to the electrical assembly 128.

By maintaining multiple electrical conductors, both the middle conductor 310, and the inner conductor 350 can carry the photocurrent (e.g., electrical signal). This can at least partially shield the photocurrent from electromagnetic interference. As such, the described triaxial arrangement (e.g., three conductors extending along a shared axis with the conductors electrically insulated from one another) and signal path(s) can protect the photocurrent (e.g., electrical signal) from unintended coupling or interference that may be present in the housing 202.

Additionally, one or more of the outer conductor 210, the first insulator 220, the middle conductor 310, the second insulator 330, and the inner conductor 350 can include an inorganic material. The use of inorganic materials (e.g., such as high temperature inorganic materials) allows for the seal assembly 200, positioned within the sensor assembly 120, to withstand relatively higher temperatures than those withstood by previous designs. More particularly, the seal assembly 200 can withstand temperatures in the range of up to 325° C. or greater without outgassing materials that could deposit on the photodiode 400 and reduce its sensitivity. Additionally, the inorganic material is relatively resistant to breakdown at temperatures up to 325° C. or greater, thus limiting the likelihood of unwanted materials or byproducts of breakdown as may occur with organic materials.

In addition, the seal assembly 200 can form a hermetic barrier that limits/prevents passage of unwanted/unintended materials and/or gases through the seal assembly 200. More particularly, the attachment of the components/parts of the seal assembly 200 described above, including the outer conductor 210, the first insulator 220, the middle conductor 310, the second insulator 330, and the inner conductor 350, can form the hermetic barrier. This hermetic barrier functions to define one boundary of a sealed volume within which the photodiode 400 is contained. This sealed volume can be filled with a dry, inert gas, which can prevent oxidation of materials/structures within the sealed volume. As such, the sealed volume functions to prolong the life of the photodiode 400, etc.

Moreover, the photodiode 400 can be electrically connected to the middle conductor surface material and the inner conductor surface material with the first wire 410 and the second wire 420. In some examples, the middle conductor surface material and the inner conductor surface material, along with the first wire 410 and the second wire 420 include a gold material. This gold material has a relatively high melting point that allows for operation in the range of up to 325° C. or greater.

The invention has been described with reference to the example embodiments described above. Modifications and alterations will occur to others upon a reading and understanding of this specification. Example embodiments incorporating one or more aspects of the invention are intended to include all such modifications and alterations insofar as they come within the scope of the appended claims.

The invention claimed is:

1. A sensor assembly for a flame sensor apparatus, the sensor assembly including:
   a photodiode configured to generate a current; and
   a seal assembly supporting the photodiode, the seal assembly including:
   an inner conductor defining an inner conductor end, the inner conductor including an inner conductor surface disposed at the inner conductor end, wherein the photodiode is attached to the inner conductor end of the inner conductor, the photodiode electrically connected to the inner conductor surface; and
   one or more insulators for electrically insulating the inner conductor, the one or more insulators including an inorganic material that is a high temperature inorganic material for use up to about 325° C.

2. The sensor assembly of claim 1, wherein the seal assembly includes:
   a middle conductor defining a middle conductor volume within which the inner conductor extends, the middle conductor including a middle conductor surface disposed at a middle conductor end of the middle conductor, the photodiode electrically connected to the middle conductor surface.

3. The sensor assembly of claim 2, wherein the one or more insulators include a second insulator extending within the middle conductor volume and attached to the middle conductor at an outer radial side of the second insulator, the second insulator attached to the inner conductor at an inner radial side of the second insulator, the second insulator including an inorganic material that is a high temperature inorganic material for use up to about 325° C.

4. The sensor assembly of claim 1, wherein the seal assembly provides part of an enclosure of a sealed volume within which the photodiode is located.

5. The sensor assembly of claim 1, wherein the seal assembly is a triaxial arrangement that includes an inner conductor, middle conductor and an outer conductor such that the seal assembly that is the triaxial arrangement conducts, and provides electromagnetic shielding of, the current generated by the photodiode.

6. The sensor assembly of claim 2, wherein the middle conductor surface includes a middle conductor surface material that is different than a middle conductor material of the middle conductor.

7. The sensor assembly of claim 6, wherein the middle conductor surface material is a conductive corrosion resistant material.

8. The sensor assembly of claim 2, wherein the middle conductor material of the middle conductor and the middle conductor surface material are the same.

9. The sensor assembly of claim 1, wherein the inner conductor surface includes an inner conductor surface material that is a conductive corrosion resistant material.

10. The sensor assembly of claim 9, wherein the inner conductor surface material is different than an inner conductor material of the inner conductor.

11. The sensor assembly of claim 9, wherein the inner conductor surface material is the same as an inner conductor material of the inner conductor.

12. A sensor assembly for a flame sensor apparatus, the sensor assembly including:
    photodiode configured to generate a current; and
    a seal assembly supporting the photodiode, the seal assembly including:
    a middle conductor extending within a housing, the middle conductor defining a middle conductor volume, the middle conductor including a middle conductor surface disposed at a middle conductor end of the middle conductor; and
    an inner conductor extending within the middle conductor volume and defining an inner conductor end, the inner conductor including an inner conductor surface disposed at the inner conductor end, wherein the photodiode is attached to the inner conductor end of the inner conductor, the photodiode electrically connected to the middle conductor surface and to the inner conductor surface.

13. The sensor assembly of claim 12, wherein the seal assembly includes one or more insulators attached to at least one of the middle conductor or the inner conductor, the one or more insulators including an inorganic material that is a high temperature inorganic material for use up to about 325° C.

14. The sensor assembly of claim 13, wherein the one or more insulators includes a second insulator that is attached to the middle conductor at an outer radial side of the second insulator, the second insulator attached to the inner conductor at an inner radial side of the second insulator.

15. The sensor assembly of claim 13, wherein the one or more insulators includes a first insulator that is attached to the middle conductor such that the middle conductor extends within the first insulator.

16. The sensor assembly of claim 15, wherein the seal assembly includes an outer conductor that is attached to the first insulator at an outer radial side of the first insulator.

17. The sensor assembly of claim 12, wherein the middle conductor surface includes a middle conductor surface material, the middle conductor surface material including a conductive corrosion resistant material.

18. The sensor assembly of claim 12, wherein the inner conductor surface includes an inner conductor surface material, the inner conductor surface material including a conductor corrosion resistant material.

19. A flame sensor apparatus including:
    a photodiode configured to generate a current; and
    a seal assembly supporting the photodiode, the seal assembly for use up to about 325° C., the seal assembly including:
    an inner conductor defining an inner conductor end, the inner conductor including an inner conductor surface disposed at the inner conductor end, wherein the photodiode is attached to the inner conductor end of the inner conductor, the photodiode electrically connected to the inner conductor surface such that the current is transmitted through the inner conductor surface.

20. The flame sensor apparatus of claim 19, wherein the seal assembly is a triaxial arrangement that includes an inner conductor, middle conductor and an outer conductor such that the seal assembly that is the triaxial arrangement conducts, and provides electromagnetic shielding of, the current generated by the photodiode.

* * * * *

UNITED STATES PATENT AND TRADEMARK OFFICE
CERTIFICATE OF CORRECTION

| | |
|---|---|
| PATENT NO. | : 9,530,904 B2 |
| APPLICATION NO. | : 14/494856 |
| DATED | : December 27, 2016 |
| INVENTOR(S) | : Joseph Cleary Blakemor et al. |

Page 1 of 1

It is certified that error appears in the above-identified patent and that said Letters Patent is hereby corrected as shown below:

On the Title Page

Item (54) Title delete "TEMERATURE" and insert therefor --TEMPERATURE--.

Signed and Sealed this
Sixteenth Day of May, 2017

Michelle K. Lee
*Director of the United States Patent and Trademark Office*